(12) United States Patent
Sarov et al.

(10) Patent No.: US 10,101,507 B2
(45) Date of Patent: Oct. 16, 2018

(54) MIRROR DEVICE

(71) Applicant: Carl Zeiss SMT GmbH, Oberkochen (DE)

(72) Inventors: Yanko Sarov, Aalen (DE); Markus Holz, Aalen (DE); Fabian Haacker, Aalen (DE); Mark Christof Wengler, Heindenheim an der Brenz (DE); Markus Hauf, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/621,555

(22) Filed: Jun. 13, 2017

(65) Prior Publication Data

US 2017/0276842 A1 Sep. 28, 2017

Related U.S. Application Data

(63) Continuation of application No. PCT/EP2015/079829, filed on Dec. 15, 2015.

(30) Foreign Application Priority Data

Dec. 17, 2014 (DE) .................. 10 2014 226 272

(51) Int. Cl.
  *G02B 5/08* (2006.01)
  *G02B 5/09* (2006.01)
  *G03F 7/20* (2006.01)

(52) U.S. Cl.
  CPC ............. *G02B 5/09* (2013.01); *G02B 5/08* (2013.01); *G03F 7/702* (2013.01); *G03F 7/70075* (2013.01); *G03F 7/70116* (2013.01); *G03F 7/70908* (2013.01)

(58) Field of Classification Search
  CPC ......... G02B 5/09; G02B 5/08; G03F 7/70075; G03F 7/70116; G03F 7/702; G03F 7/70908
  USPC ........................................................ 359/604
  See application file for complete search history.

(56) References Cited

U.S. PATENT DOCUMENTS

| 6,650,309 B1 * | 11/2003 | Kimura .................. G02B 26/02 345/108 |
| 9,116,440 B2 | 8/2015 | Hauf et al. |
| 2002/0096647 A1 | 7/2002 | Moors et al. |
| 2003/0043455 A1 | 3/2003 | Singer et al. |
| 2011/0194318 A1 | 8/2011 | Kono |

(Continued)

FOREIGN PATENT DOCUMENTS

| DE | 10 2013 218 748 A1 | 10/2014 |
| EP | 1 225 481 A | 7/2002 |
| WO | WO 2009/100856 A1 | 8/2009 |

(Continued)

OTHER PUBLICATIONS

International Search Report for corresponding PCT Appl No. PCT/EP2015/079829, dated Mar. 18, 2016.

(Continued)

*Primary Examiner* — William R Alexander
(74) *Attorney, Agent, or Firm* — Fish & Richardson P.C.

(57) ABSTRACT

A mirror device includes at least one electrically conductive shielding element, which forms a mechanism for producing an electric field in a region adjacent to at least one side surface and/or a rear side of a mirror body.

20 Claims, 10 Drawing Sheets

(56) References Cited

U.S. PATENT DOCUMENTS

2014/0211187 A1* 7/2014 Hauf .................... G02B 7/1815
                                                    355/67
2016/0077442 A1    3/2016 Staicu et al.

FOREIGN PATENT DOCUMENTS

WO    WO 2010/049076  A2    5/2010
WO    WO 2010/049976  A1    5/2010

OTHER PUBLICATIONS

German Examination Report, with translation thereof, for corresponding DE Appl No. 10 2014 226 272.0, dated Jul. 13, 2015.

* cited by examiner

MIRROR DEVICE

CROSS-REFERENCE TO RELATED APPLICATIONS

The present application is a continuation of, and claims benefit under 35 USC 120 to, international application PCT/EP2015/079829, filed Dec. 15, 2015, which claims benefit under 35 USC 119 of German Application No. 10 2014 226 272.0, filed Dec. 17, 2014. The entire disclosure of international application PCT/EP2015/079829 and German Application No. 10 2014 226 272.0 are incorporated by reference herein.

FIELD

The disclosure relates to a mirror device, in particular a mirror device for an EUV projection exposure apparatus. The disclosure also relates to an illumination optical unit for a projection exposure apparatus, an illumination system with such an illumination optical unit and a projection exposure apparatus with such an illumination optical unit. In addition, the disclosure relates to a method for producing a microstructured or nanostructured component and to a component produced according to the method.

BACKGROUND

For example, WO 2009/100856 A1 discloses a facet mirror for a projection exposure apparatus that has a multiplicity of individually displaceable individual mirrors. To ensure the optical quality of a projection exposure apparatus, very precise positioning of the displaceable individual mirrors is desirable.

SUMMARY

The disclosure seeks to provide an improved mirror device, in particular a mirror device for a projection exposure apparatus. The disclosure provides a mirror device with at least one mirror and at least two electrically conductive shielding elements, it being possible for different electrical voltages to be applied to the at least two electrically conductive shielding elements, and a mechanism for producing an electric field in a region adjacent to the at least one side surface and/or the rear side.

According to the disclosure, it has been recognized that such an electric field can serve for shielding a predetermined volume from free charges. Via the shielding elements according to the disclosure, it can be ensured in particular that a volume behind the rear side of the mirror is shielded from free charges. It is possible in particular to ensure that sensitive components, in particular components that serve for controlling the displacement of the mirror and/or for determining the position of the mirror, in particular actuators and/or sensors and/or associated signal lines, are shielded from free charges.

The mirror device is in particular an optical component for use in a projection exposure apparatus, in particular in an EUV projection exposure apparatus. The mirror device is used in particular in a rarefied gas environment, in particular in a vacuum environment or a hydrogen environment with a reduced pressure of at most 50 Pa, in particular an $H_2$ partial pressure.

The front side of the mirror body includes in particular a reflection surface. It may in particular form the reflection surface. The reflection surface may in particular extend over the entire front side of the mirror body.

The mirror is in particular formed as a mirror for EUV radiation. It is in particular designed for the reflection of radiation in the EUV range, in particular for radiation with a wavelength in the range of 5 nm to 30 nm, in particular a wavelength of 13.5 nm. The reflection surface may be formed by a multilayer. The mirror may also be a mirror for DUV or VUV radiation.

The mirror device is in particular suitable for use in an evacuable chamber. It may in particular be arranged in an evacuable chamber of a projection exposure apparatus that is evacuated during the operation of the projection exposure apparatus to a pressure of less than 50 Pa, in particular less than 20 Pa, in particular less than 10 Pa, in particular less than 5 Pa. This pressure gives in particular the partial pressure of hydrogen in the chamber.

The mirror device is in particular suitable for use in a partially or completely ionized environment, in particular in a plasma environment.

It has also been recognized that the illumination radiation can cause an ionization or plasma formation in the environment of the mirror device. Without suitable protective measures, this can have the effect that charged particles reach the rear side of the mirrors, in particular a volume behind the mirrors, in particular actuators for the displacement of the mirrors and/or sensors and/or their connecting lines, and consequently lead to disturbances of the positioning of the mirrors. According to the disclosure, it is envisaged to prevent this by producing an electric field in a region adjacent to the at least one side surface and/or the rear side of the mirror. A suitable electric field can in particular have the effect of preventing particles that are ionized by the illumination radiation from reaching a volume that is to be protected behind the mirror.

According to one aspect of the disclosure, the electric field has a field strength of up to $10^7$ V/m, in particular up to $10^8$ V/m. The field strength is in particular at least $10^5$ V/m, in particular at most $10^6$ V/m.

The electric field can in particular have the effect of shielding the volume in the region directly behind the mirror body, in particular the volume that is delimited in the case of a parallel projection in the direction parallel to a normal to the reflection surface of the mirror in the unpivoted state. This volume is also referred to as the shadow casting volume.

Sensitive components, in particular sensitive electronic components, and/or conductor tracks and/or materials that react sensitively to ionized particles, may be arranged in the shielded volume.

According to one aspect of the disclosure, the electric field is produced in a region adjacent to the side surface of the mirror that extends in particular perpendicularly to the aforementioned normal to the reflection surface of the mirror. The electric field may in particular be produced in the region between two adjacent mirrors, that it say in the region of the intermediate space between two adjacent mirrors. This can have the effect of preventing charged particles from being able to pass through this intermediate space from the volume in front of the front side of the mirror to the rear side of the mirror.

According to one aspect of the disclosure, the shielding element is formed as a conductor track, wire, electrically conductive strip or layer of doped silicon or includes such a structure. The shielding element may in particular cover the entire surface area of the side wall of a mirror. It may also only cover a narrower strip of the same. The strip runs in particular parallel to the reflection surface of the mirror, in particular to the front border of the side surface of the mirror. It has generally been found that, the wider this strip is formed, the lower the shielding voltage that is applied to the shielding element can be chosen. Voltage may in particular be applied to the shielding elements by way of electrical supply lines in the mirror body.

The shielding element may also consist of a plurality of wires, in particular a grid, or include such a grid. It may also be formed in the manner of a coil or include in each case one or more coils or coil-like structures. In this case, a magnetic field that can be produced by the coils or coil-like structures may also serve for the shielding from free charge carriers. In this case, the current intensity in the conductor track is the decisive parameter for the shielding effect.

According to a further aspect of the disclosure, at least one of the electrically conductive shielding elements is arranged in the region of the at least one side surface and/or in the region on or behind the rear side of the mirror. In the case of a forwardly facing reflection surface of the mirror, the shielding element may in particular be arranged behind the rear side of the mirror.

It has been found that, as a result, the volume in the region behind the mirror body can be effectively shielded.

The electrically conductive shielding element may be arranged directly on or in the mirror body. It may also be arranged on a substrate that serves for the mechanical mounting of the mirror body.

According to a further aspect of the disclosure, the mirror device includes a voltage source for applying electrical voltage to at least one of the electrically conductive shielding elements, in particular in the range of −300 V to 300 V. The amount of the electrical voltage made available by the voltage source is in particular at least 10 V, in particular at least 20 V, in particular at least 30 V, in particular at least 50 V, in particular at least 70 V. It is in particular at most 300 V, in particular at most 200 V. It may in particular be at most 100 V.

According to the disclosure, it has been recognized that the value of the shielding voltage for shielding from free charge carriers depends on the geometry of the mirror bodies, in particular on their extent in the direction perpendicular to the reflection surface, and also the distance between adjacent mirror bodies. It also depends on the energy of the photons of the illumination radiation and also the ionization energy of the gas particles in the region of the mirror element. It has been possible to show that effective shielding of the sensitive components can be achieved with the aforementioned values of the shielding voltage.

According to a further aspect of the disclosure, a direct voltage, in particular a substantially constant direct voltage, is applied to the shielding element. The voltage used for being applied to the shielding element is also referred to as the shielding voltage. According to one aspect of the disclosure, the shielding voltage is at least as great as the voltage in the signal lines that are provided for controlling the positioning of the mirror. It is in particular greater by at least a factor of 2, in particular at least a factor of 3, in particular at least a factor of 5, in particular at least a factor of 10, than the voltage in the signal lines that are provided for controlling the positioning of the mirror. In particular, an electrical voltage of a maximum of 100 V, in particular a maximum of 24 V, in particular a maximum of 12 V, in particular a maximum of 6 V, in particular a maximum of 3.3 V, is applied to the signal lines.

The exact value of the shielding voltage may be chosen in dependence on the geometrical arrangement of the shielding element and the region to be shielded.

According to a further aspect of the disclosure, the mirror device includes a control device for controlling to a setpoint value the electrical voltage that is applied to at least one of the electrically conductive shielding elements. This makes it possible to adapt the shielding voltage flexibly to the respective desired properties. The shielding is in this case also referred to as active shielding. It should be understood in particular as meaning that a controlled voltage is applied to the shielding line.

According to a further aspect of the disclosure, the shielding elements are respectively arranged in pairs. This makes it easier to control precisely the electric field that serves for the shielding from the free charges.

It may be envisaged in particular to arrange a number, in particular two, in particular four, shielding elements in each of one or more of the mirror bodies, in particular in all of the mirror bodies.

According to one aspect of the disclosure, the shielding elements are respectively arranged in or on different side surfaces of the mirror bodies. According to one aspect of the disclosure, a shielding element is in particular arranged in or on each of the side surfaces of the mirror body. This makes it possible in particular to produce an electric field for shielding from the free charges in each of all the regions between adjacent mirrors.

According to a further aspect of the disclosure, the mirror device includes a plurality of mirrors. The mirrors are in particular arranged in an array, in particular in rows and columns, that is to say in the manner of a matrix. The disclosure relates in particular to such a mirror array, which is also referred to as a multi-mirror array. The number of mirrors of the mirror device is in particular at least 100, in particular at least 1000, in particular at least 10 000, in particular at least 100 000. The number is usually less than 1 000 000.

The mirror device is in particular formed as a microelectromechanical system (MEMS), in particular as a microoptoelectromechanical system (MOEMS). It may in particular serve as a facet mirror, in particular as a field facet mirror, of an illumination optical unit for a projection exposure apparatus, or form such a facet mirror.

Adjacent mirrors of the mirror device are arranged respectively spaced apart from one another by small interspaces. Here it is envisaged to keep the interspaces as small as possible, in particular as narrow as possible. The relative size of the interspaces may be characterized by the filling factor of the mirror device. This value is also referred to as the integration density. The integration density refers in particular to the ratio of the sum of the reflection surfaces of the individual mirrors to the overall surface area of the mirror device, that is to say the sum of the reflection surfaces of the mirrors or the interspaces between them. The filling factor or the integration density of the mirror device is at least 0.5, in particular at least 0.6, in particular at least 0.7, in particular at least 0.8, preferably at least 0.9, preferably at least 0.96.

According to a further aspect of the disclosure, a shielding element or a pair of shielding elements is respectively assigned to each interspace between two adjacent mirrors. It is also possible to assign the interspaces more than two shielding elements.

According to one aspect of the disclosure, at least one shielding element is respectively arranged in the region behind an interspace between two adjacent mirrors. The shielding element is in this case preferably arranged on the substrate that serves for the mounting of the mirror bodies and/or for the arrangement of the control electronics for the displacement of the mirrors.

The region behind an interspace refers here in particular to the volume region on the rear side of the mirror body that free charges from the volume region in front of the front side of the mirror body can in principle reach when there is a trajectory in a straight line. It may in particular be the region that is defined by a projection of the region of the interspace between two adjacent mirrors onto the substrate. The projection may be a perpendicular projection onto the substrate. It may also be an oblique projection onto the substrate.

According to a further aspect of the disclosure, two shielding elements are respectively arranged in pairs in the region of mutually opposite side surfaces of adjacent mirrors. They serve in particular for building up an electric field in the region of the interspace between the adjacent mirrors.

Shielding elements in the region behind the interspace and/or shielding elements arranged in pairs on mutually opposite sides of the interspace are a particularly effective way of preventing charges, in particular high-energy charge carriers, from the region in front of the front side of the mirrors from reaching the region behind the rear side of the mirrors, in particular the region with sensitive electrical components. This allows the positioning of the individual mirrors to be improved. It is in particular possible to improve the stability of the positioning of the individual mirrors.

Further aspects of the disclosure are to improve an illumination optical unit and an illumination system for a projection exposure apparatus and also a corresponding projection exposure apparatus. These aspects are achieved by an illumination optical unit with at least one mirror device according to the foregoing description or an illumination system and a projection exposure apparatus with such an illumination optical unit. The advantages are evident from those of the mirror device.

Further aspects of the disclosure are to improve a method for producing a microstructured or nanostructured component and also a corresponding component. These aspects are achieved by providing a projection exposure apparatus according to the disclosure. The advantages are likewise evident from those of the mirror device.

BRIEF DESCRIPTION OF THE DRAWINGS

Further details and advantages of the disclosure will become apparent from the description of exemplary embodiments with reference to the drawings, in which.

DESCRIPTION OF EXEMPLARY EMBODIMENTS

There follows first of all a description by way of example of the general structure and the main component parts of a microlithographic projection exposure apparatus 1. The description of the general details should be understood as being purely exemplary, in particular not restrictive.

Figure 1:
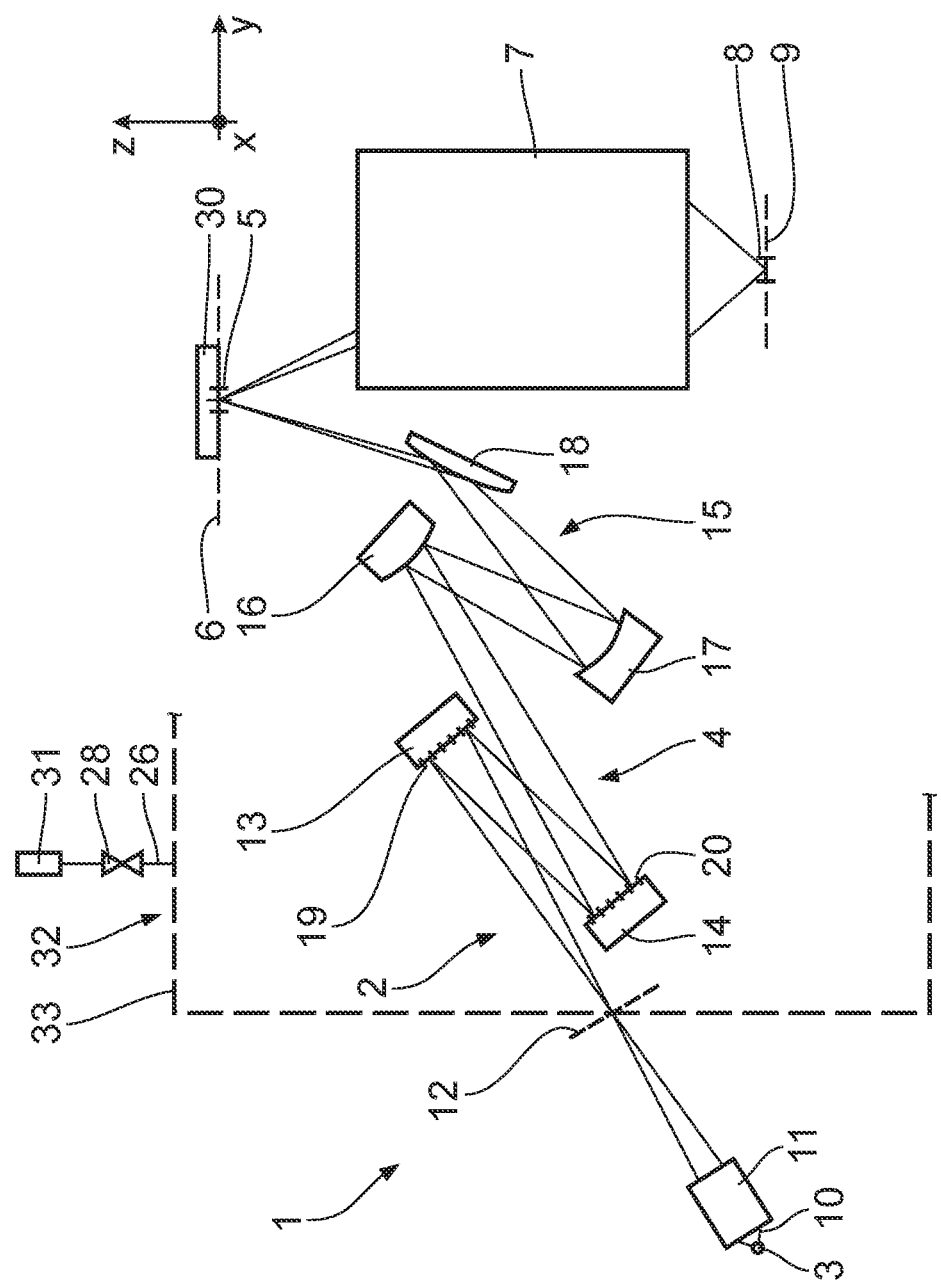
FIG. 1 shows a schematic representation of a microlithographic projection exposure apparatus.

FIG. 1 schematically shows a microlithographic projection exposure apparatus 1 in a meridional section. An illumination system 2 of the projection exposure apparatus 1 has, besides a radiation source 3, an illumination optical unit 4 for the exposure of an object field 5 in an object plane 6. The object field 5 can be shaped in a rectangular fashion or in an arcuate fashion with an x/y aspect ratio of 13/1, for example. In this case, a reflective reticle 30 (not represented in FIG. 1) arranged in the object field 5 is exposed, the reticle bearing a structure to be projected by the projection exposure apparatus 1 for the production of micro- or nanostructured semiconductor components. A projection optical unit 7 serves for imaging the object field 5 into an image field 8 in an image plane 9. The structure on the reticle 30 is imaged onto a light-sensitive layer of a wafer, which is not represented in the drawing and is arranged in the region of the image field 8 in the image plane 9.

The reticle 30, which is held by a reticle holder (not represented), and the wafer, which is held by a wafer holder (not represented), are scanned synchronously in the y direction during the operation of the projection exposure apparatus 1. Depending on the imaging scale of the projection optical unit 7, it is also possible for the reticle 30 to be scanned in the opposite direction relative to the wafer.

The radiation source 3 is an EUV radiation source having an emitted used radiation in the range of between 5 nm and 30 nm. This can be a plasma source, for example a GDPP (Gas Discharge Produced Plasma) source or an LPP (Laser Produced Plasma) source. Other EUV radiation sources, for example those based on a synchrotron or on a free electron laser (FEL), are also possible.

It may also be a VUV radiation source, in particular for generating radiation with a wavelength of less than 200 nm.

EUV radiation 10 emerging from the radiation source 3 is focused by a collector 11. A corresponding collector is known for example from EP 1 225 481 A. Downstream of the collector 11, the EUV radiation 10 propagates through an intermediate focal plane 12 before being incident on a field facet mirror 13. The field facet mirror 13 is arranged in a plane of the illumination optical unit 4 which is optically conjugate with respect to the object plane 6.

The EUV radiation 10 is also referred to hereinafter as used radiation, illumination light or as imaging light. The used radiation may also be VUV radiation, in particular with a wavelength of less than 200 nm.

Downstream of the field facet mirror 13, the EUV radiation 10 is reflected by a pupil facet mirror 14. The pupil facet mirror 14 lies either in the entrance pupil plane of the illumination optical unit 7 or in an optically conjugate plane with respect thereto. The field facet mirror 13 and the pupil facet mirror 14 are constructed from a multiplicity of individual mirrors, which will be described in even greater detail below. In this case, the sub-division of the field facet mirror 13 into individual mirrors can be such that each of the field facets 19 which illuminate the entire object field 5 by themselves is represented by exactly one of the individual mirrors. Alternatively, it is possible to construct at least some or all of the field facets 19 using a plurality of such individual mirrors. The same correspondingly applies to the configuration of the pupil facets 20 of the pupil facet mirror 14, which are respectively assigned to the field facets 19 and which can be formed in each case by a single individual mirror or by a plurality of such individual mirrors.

The EUV radiation 10 impinges on the two facet mirrors 13, 14 at an angle of incidence that is less than or equal to 25°. The EUV radiation 10 therefore impinges on the two facet mirrors in the range of normal incidence operation. Impingement with grazing incidence is also possible. The pupil facet mirror 14 is arranged in a plane of the illumination optical unit 4 which constitutes a pupil plane of the projection optical unit 7 or is optically conjugate with respect to a pupil plane of the projection optical unit 7. With the aid of the pupil facet mirror 14 and an imaging optical assembly in the form of a transfer optical unit 15 with mirrors 16, 17 and 18 designated in the order of the beam path for the EUV radiation 10, the field facets 19 of the field facet mirror 13 are imaged into the object field 5 in a manner in which they are superposed on one another. The last mirror 18 of the transfer optical unit 15 is a mirror for grazing incidence ("grazing incidence mirror"). The transfer optical unit 15 together with the pupil facet mirror 14 is also referred to as a sequential optical unit for transferring the EUV radiation 10 from the field facet mirror 13 toward the object field 5. The illumination light 10 is guided from the radiation source 3 toward the object field 5 via a plurality of illumination channels. Each of these illumination channels is assigned a field facet 19 of the field facet mirror 13 and a pupil facet of the pupil facet mirror 14, the pupil facet being disposed downstream of the field facet. The individual mirrors of the field facet mirror 13 and of the pupil facet mirror 14 can be tiltable by an actuator system, such that a change in the assignment of the pupil facets 20 to the field facets 19 and correspondingly a changed configuration of the illumination channels can be achieved. This results in different illumination settings, which differ in the distribution of the illumination angles of the illumination light 10 over the object field 5.

In order to facilitate the explanation of positional relationships, use is made below of, inter alia, a global Cartesian xyz-coordinate system. The x axis runs perpendicular to the plane of the drawing toward the observer in FIG. 1. The y axis runs toward the right in FIG. 1. The z axis runs upward in FIG. 1.

Different illumination settings can be achieved via a corresponding tilting of the individual mirrors of the field facet mirror 13 and a corresponding change in the assignment of the individual mirrors of the field facet mirror 13 to the individual mirrors of the pupil facet mirror 14. Depending on the tilting of the individual mirrors of the field facet mirror 13, the individual mirrors of the pupil facet mirror 14 that are newly assigned to the individual mirrors are tracked, if desired, by tilting such that an imaging of the field facets 19 of the field facet mirror 13 into the object field 5 is once again ensured.

The field facet mirror 13 in the form of a multi- or micro-mirror array (MMA) forms an optical assembly for guiding the used radiation 10, that is to say the EUV radiation beam. The field facet mirror 13 is formed as a microelectromechanical system (MEMS). It has a multiplicity of individual mirrors 27 arranged in a matrix-like manner in rows and columns in an array. The individual mirrors 27 are designed to be tiltable by an actuator system, as will be explained below. Overall, the field facet mirror 13 has approximately 100 000 of the individual mirrors 27. Depending on the size of the individual mirrors 27, the field facet mirror 13 can also have for example 1000, 5000, 7000 or else several hundreds of thousands of individual mirrors 27, in particular at least 100 000, in particular at least 300 000, in particular at least 500 000.

A spectral filter, which separates the used radiation 10 from other wavelength components of the emission of the radiation source 3 that are not usable for the projection exposure, may be arranged upstream of the field facet mirror 13, that is to say between the radiation source 3 and the field facet mirror 13. The spectral filter is not represented.

The field facet mirror 13 is impinged on by used radiation 10 having a power of 840 W and a power density of 6.5 kW/m$^2$. Generally, other powers and power densities are also possible. The power density is at least 500 W/m$^2$, in particular at least 1 kW/m$^2$, in particular at least 5 kW/m$^2$, in particular at least 10 kW/m$^2$, in particular at least 60 kW/m$^2$.

The entire individual mirror array of the facet mirror 13 has a diameter of 500 mm and is designed in a closely packed manner with the individual mirrors 27. Insofar as a field facet 19 is realized by exactly one individual mirror in each case, the individual mirrors 27 represent the shape of the object field 5, apart from a scaling factor. The facet mirror 13 can be formed from 500 individual mirrors 27 each representing a field facet 19 and having a dimension of approximately 5 mm in they direction and 100 mm in the x direction. As an alternative to the realization of each field facet 19 by exactly one individual mirror 27, each of the field facets 19 can be approximated by groups of smaller individual mirrors 27. A field facet 19 with dimensions of 5 mm in they direction and of 100 mm in the x direction can be constructed e.g. via a 1×20 array of individual mirrors 27 having dimensions of 5 mm×5 mm through to a 10×200 array of individual mirrors 27 having dimensions of 0.5 mm×0.5 mm. More complex divisions of the mirror surfaces are possible. The individual mirrors 27 can in particular be tilted individually. The area coverage of the complete field facet array by the individual mirrors 27 may be at least 70%, in particular at least 80%, in particular at least 90%.

The used light 10 is reflected by the individual mirrors 27 of the facet mirror 13 toward the pupil facet mirror 14. The pupil facet mirror 14 has approximately 2000 static pupil facets 20. The latter are arranged alongside one another in a plurality of concentric rings, such that the pupil facet 20 of the innermost ring is fashioned in a sector-shaped manner and the pupil facets 20 of the rings directly adjacent thereto are fashioned in a ring-sector-shaped manner. In a quadrant of the pupil facet mirror 14, 12 pupil facets 20 can be present alongside one another in each of the rings. The pupil facets 20 may be formed in each case in a simply connected fashion. Some other arrangement of the pupil facets 20 is likewise possible. They may also be formed by a multiplicity of individual mirrors 27. The pupil facet mirror 14 may in particular also be formed as a multi-mirror array (MMA) with a multiplicity of individual mirrors 27. It may in particular be formed as a MEMS. It generally forms a second faceted mirror.

The used light 10 is reflected by the pupil facets 20 toward a reflecting reticle 30, which is arranged in the object plane 6. This is then followed by the projection optical unit 7, as explained above.

The individual mirrors 27 of the field facet mirror 13 and of the pupil facet mirror 14 carry multilayer coatings for optimizing the reflectivity thereof at the wavelength of the used radiation 10. The temperature of the multilayer coatings should not exceed 425 K during the operation of the projection exposure apparatus 1.

For details of the structure of the individual mirrors 27 and their displaceability, reference should be made to WO 2010/049 076 A1. This publication is incorporated to its full extent as a component part in the present application.

The illumination optical unit 4 is accommodated in an evacuable chamber 32, a boundary wall 33 of which is indicated in FIG. 1. The chamber 32 communicates with a vacuum pump 31 via a fluid line 26, in which a shutoff valve 28 is accommodated.

The operating pressure in the evacuable chamber 32 is a few Pa (partial pressure of $H_2$). The partial pressure of hydrogen is in particular at most 50 Pa, in particular at most 20 Pa, in particular at most 10 Pa, in particular at most 5 Pa. All other partial pressures are significantly below $1 \times 10^{-7}$ mbar. The chamber 32 may in particular be evacuated to a high vacuum or ultrahigh vacuum.

Together with the evacuable chamber 32, the mirror having the plurality of individual mirrors 27 is a component part of an optical component for guiding a bundle of the EUV radiation 10. The individual mirror 27 may be part of one of the facet mirrors 13, 14.

Each of the individual mirrors 27 may have an impingeable reflection surface 34 having dimensions of 0.5 mm×0.5 mm or else of 5 mm×5 mm or larger. The reflection surface 34 is part of a mirror body 35 of the individual mirror 27. The mirror body 35 carries the multilayer coating. The individual mirrors 27 or the reflection surface 34 thereof may also have other dimensions. They are in particular formed as tiles, with which a two-dimensional surface area can be tessellated. They are in particular formed in a triangular, quadrilateral, in particular square, or hexagonal fashion. Their side lengths have in particular dimensions of at most 10 mm, in particular at most 5 mm, in particular at most 3 mm, in particular at most 1 mm, in particular at most 0.5 mm, in particular at most 0.3 mm, in particular at most 0.1 mm. They may consequently be in particular micromirrors. These may be understood in particular as mirrors with dimensions in the micrometer range.

The individual mirrors 27 are displaceable, that is to say positionable, in each case via an actuator device with a number of electromagnetically, in particular electrostatically, operating actuators. The actuators can be produced in a batch process as a microelectromechanical system (MEMS). For details, reference should once again be made to WO 2010/049 076 A1.

A sum of the reflection surfaces 34 on the mirror bodies 35 is greater than 0.5 of a total surface area covered by the overall reflection surface of the field facet mirror 13. The total surface area is in this case defined as the sum of the reflection surfaces 34 plus the the area covered by the interspaces between the reflection surfaces 34. The ratio of the sum of the reflection surfaces of the mirror bodies on the one hand to this total surface area is also referred to as the integration density. This integration density may also be greater than 0.6, in particular greater than 0.7, in particular greater than 0.8, in particular greater than 0.9.

With the aid of the projection exposure apparatus 1, at least one part of the reticle 30 is imaged onto a region of a light-sensitive layer on the wafer for the lithographic production of a micro- or nanostructured component, in particular of a semiconductor component, e.g. of a microchip. Depending on the embodiment of the projection exposure apparatus 1 as a scanner or as a stepper, the reticle 30 and the wafer are moved in a temporally synchronized manner in the y direction continuously in scanner operation or step by step in stepper operation.

The illumination optical unit 4 is preferably operated in a high vacuum or ultrahigh vacuum. A plasma 45, in particular a hydrogen plasma, may form in the region in front of the individual mirrors 27, in particular in front of the mirror bodies 35 with the reflection surfaces 34. The plasma 45 may be produced in particular by high-energy photons of the used radiation 10. The properties of the plasma 45 are consequently dependent in particular on the properties of the radiation source 3, in particular its operating mode, in particular its pulse frequency and/or pulse duration and/or intensity, and also the atmosphere in the chamber 32.

There follows a description of further details of the facet mirror 13 formed as a multi-mirror array 29 (MMA). The multi-mirror array 29 generally forms an mirror device of a multiplicity of individual mirrors 27. The individual mirrors 27 are arranged on a carrying structure 36. For details, reference should be made in particular to WO 2010/049976 A1.

The mirror device generally includes at least one of the mirrors 27. The number of individual mirrors 27 of the multi-mirror array (MMA) 29 lies in the range from 1 to 1 000 000. It may in principle also be greater than that. It is in principle freely selectable as desired.

The individual mirrors 27 can be pivoted in each radial direction by at least 80 mrad, in particular at least 100 mrad, in particular at least 120 mrad. They have in particular at least two degrees of displacement freedom, in particular at least two degrees of pivoting freedom.

The individual mirrors 27 formed as micro-mirrors are suspended on microscopic bending structures. The latter may be cut out or etched out from a thin silicon wafer or from a metallic membrane or the like. The bending structures may in particular be formed two-dimensionally, that is to say in the manner of a membrane, or in the form of a beam or cardanically.

The individual mirrors 27 are displaceable by an actuator system. The actuation is preferably electrostatic or electromechanical or piezoelectric. Alternatives to this are similarly possible.

The multi-mirror array (MMA) 29 is produced by microstructuring, in particular by a sequence of microelectromechanical structuring steps, in particular using method steps such as for example lithographic steps, depositing, bonding or forming. It is produced in particular from a number of individual wafers that are bonded to one another after the processing. Details are described even more specifically below.

The electrical connections, in particular the circuits, can be produced as follows: Those running horizontally, that is to say those running in a direction parallel to a wafer surface, may be applied as thin metallic or doped semiconductor layers to the surface of the individual wafers. A printing or vapor depositing process may be provided for this. The vertical electrical connections, that is to say the connections that extend through the wafers, for example the carrying structure 36, may be produced for example as so-called through-silicon vias. A method with microelectromechanical structuring steps (MEMS method) may also be provided for this. The structuring steps may in particular include etching steps for producing depressions, in particular trenches, in a substrate, and subsequent filling of the same, in particular with an electrically conductive material, such as for example a metal or a doped semiconductor material, or filling with an electrically insulating material.

The reflection surface 34 is arranged on a forward-facing front side of the mirror body 35. It forms in particular the front side. The side of the mirrors 35 opposite from the reflection surface 34 of the individual mirrors 27 is referred to as the rear side 21 of the mirror body 27. The directional indications "front" and "rear" used hereinafter relate to the alignment of the front and rear sides of the mirror bodies 35. They serve in particular for easier description of positional relationships.

The reflection surface 34 is formed in a square fashion. It is generally preferably formed in a quadrilateral, in particular parallelogram-shaped, in particular rectangular or hexagonal fashion. It may in principle also have an alternative geometrical form. It is in particular formed in such a way that the overall reflection surface of the mirror device can be tessellated by the individual mirrors 27 substantially without any gaps.

The mirror bodies 35 each have four side surfaces 22. The side surfaces 22 respectively run between the front side of the mirror body 35 and the rear side 21 of the same. They run in particular perpendicularly in relation to the front and rear sides 21 of the mirror body 35. They may also run obliquely in relation to these sides. In this case, the mirror body 35 is formed in a frustopyramidal fashion.

Figure 2:
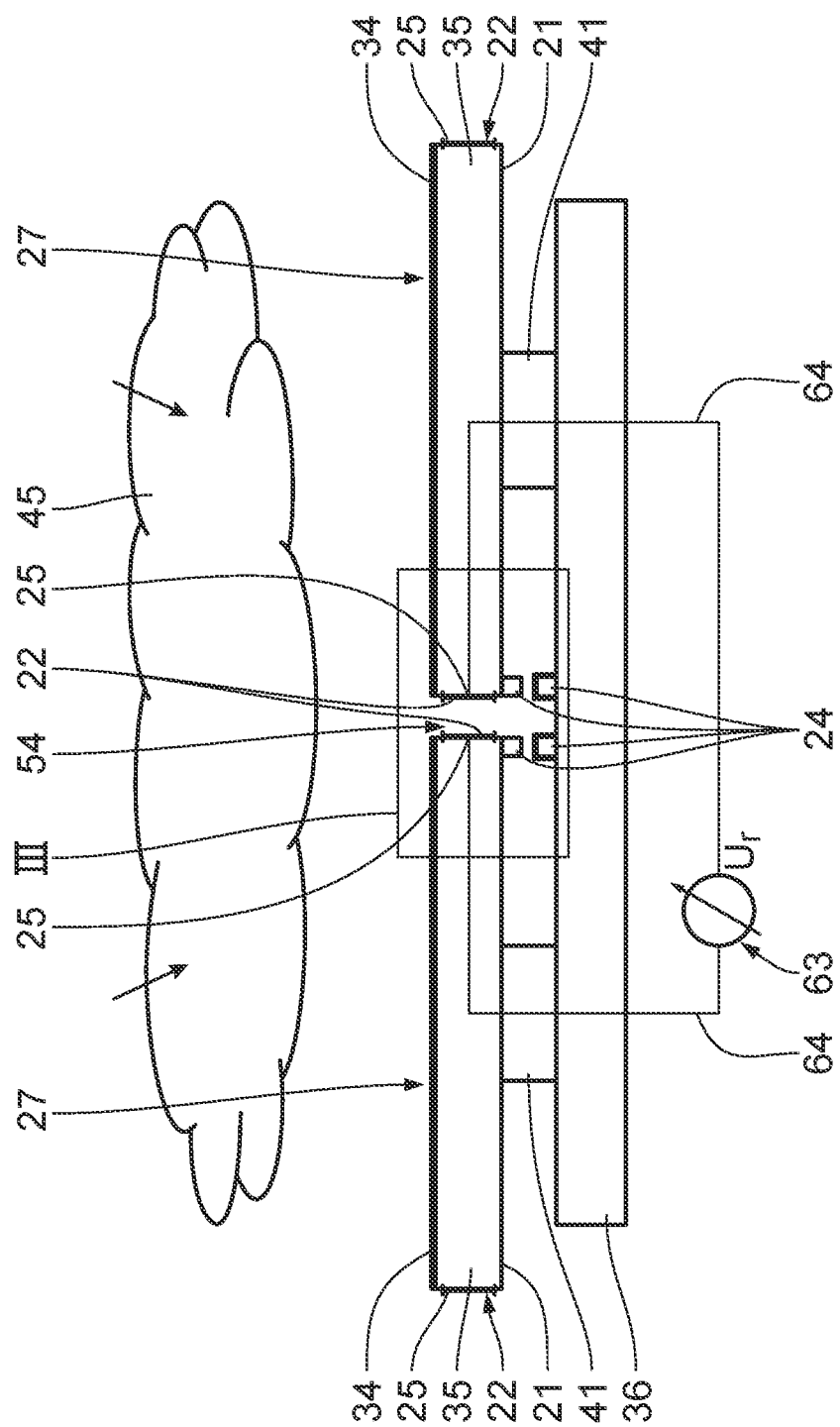
FIG. 2 shows a schematic representation of a detail of a sectional representation of a multi-mirror array in the region of two adjacent individual mirrors.

In the case of the embodiment represented in FIG. 2, a spacer 41 is arranged between the mirror body 35 and the carrying structure 36. The spacer 41 also serves as a mirror suspension. The mirror suspension fixes the pivoting point of the mirror at a fixed distance from the base plate.

Generally, the multi-mirror array 29 is formed as a microelectromechanical system (MEMS). The individual mirrors 27 are mounted flexibly, in particular pivotably. In the region behind the rear side 21 of the individual mirrors 27, electronic circuits, in particular actuator and/or sensor circuits, are provided, in particular for controlling the displacement of the individual mirrors 27. The circuits are formed in particular as application specific integrated circuits (ASICs). The ASICs are bonded onto the rear side of the supporting structure. The electrical lines between the actuator or the sensor and the ASICs run through the supporting structure 36. The ASICs may in particular be arranged in an encapsulated region, in particular a region that is sealed off tightly, in particular vacuum-tightly, from the outside. They are in particular formed and/or arranged in such a way that they can be used in a vacuum environment.

There follows a description of further details of the multi-mirror array, which serve in particular for protecting the electronics, in particular the electronic components behind the mirrors, in particular the circuits and/or the actuator systems and/or sensor systems, and also possibly the ASICs, from charged particles, which may be produced in particular by the illumination radiation. Provided in particular are mechanisms which prevent the plasma 45 produced by the illumination radiation 10 from penetrating through between the individual mirrors 27 and influencing the electronics that are arranged behind the rear side 21 of the mirror bodies 35, in particular the sensors and/or actuators and/or the signal lines thereof.

The effectiveness of the measures provided according to the disclosure has been verified, in particular analytically and by way of simulations.

It has generally been recognized that a penetration of charged particles from the volume region in front of the front side of the mirror bodies 35 into the region behind the rear side 21 of the same can be prevented by producing an electric field 23 in the region between the side surfaces 22 of the mirror bodies 35.

According to the disclosure, it has been recognized that the trajectory of a charged particle in an electric field can be determined from its kinetic energy, its pulse and the distribution of the electric field strength. It has also been recognized that it is possible by suitable adaptation of the electric field strength of the field 23 to prevent charged particles with a known maximum kinetic energy from passing from the region in front of the front side of the mirror bodies 35 into the region behind the rear side 21 of the mirror bodies 35.

Depending on a thickness d of the mirror bodies 35, in particular a corresponding extent of shielding electrodes 25, and also a distance g between adjacent mirror bodies 35, a known energy $E_{ph}$ of the photons of the illumination radiation 10 ($E_{ph}$32 91.8 eV for EUV) and also an ionization energy $E_{ion}$ of the gas particles in the chamber 32 ($E_{ion}$=15.4 eV for $H_2$), it can be determined how great a voltage $U_r$ is to decelerate the ionized particles effectively. It has been found that a voltage $U_r$ of the order of magnitude of 50 V to 100 V is sufficient to prevent charged particles from being able to pass from the plasma 45 into the region behind the rear side 21 of the mirror bodies 35.

The following estimates in particular have been obtained for the voltage $U_r$ that to prevent a penetration of charged particles from the plasma into the region behind the rear side 21 of the mirror bodies 35:

$$U_r = 2\frac{g}{d}\frac{(E_{ph} - E_{ion})}{e},$$

for $d \leq 4g$ $$U_r = \left(\frac{16g^2}{d^2 + 16g^2}\right)\frac{(E_{ph} - E_{ion})}{e} < \frac{1}{2}\frac{(E_{ph} - E_{ion})}{e},$$

for $d > 4g$, where e denotes the elementary charge.

Figure 3A:
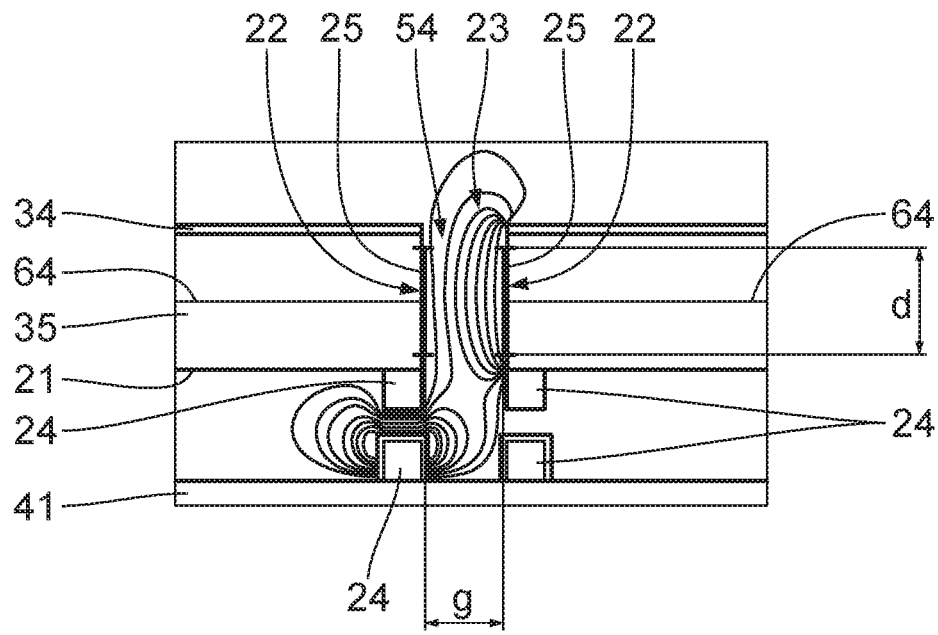
FIGS. 3A and 3B show an enlargement of a detail of the region III from FIG. 2 with an exemplary representation of a field line pattern of an electric field in different states of activation of the actuators for the displacement of the individual mirrors.
Figure 3B:
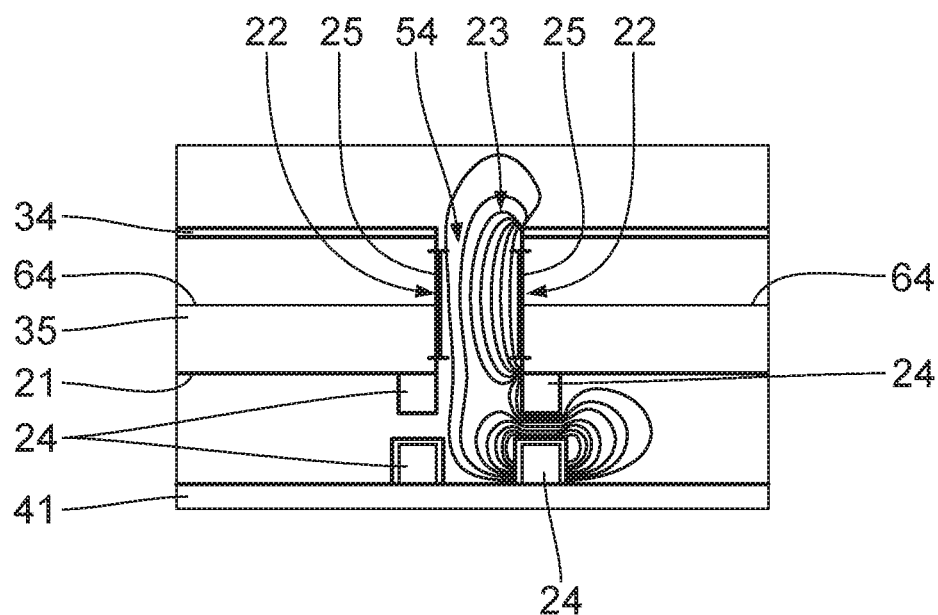

These estimates are based on the assumption that the electric field 23 in the region of interspaces 54 between the side surfaces 22 of the mirror bodies 35 is to the greatest extent uniform. It has been possible to show by realistic simulations that this is correct to a sufficient degree of approximation. Exemplary distributions of the field lines are represented in FIGS. 3A and 3B. It has been assumed here that a pair of comb electrodes 24 serves in each case for the displacement of the individual mirrors 27. The comb electrodes 24 respectively have dimensions of 20 µm·20 µm. They are arranged in each case on the rear side 21 of the mirror bodies 35. They are arranged in particular in the region of the side surface 22 of the mirror body 35. It was assumed for the simulation that a maximum voltage of 200 V is applied to them.

It was also assumed for the simulation that the mirror bodies 35 have in the direction parallel to their front and rear sides 21 dimensions of 600 μm, a thickness d of 70 μm and are kept at a distance of 50 μm from the carrying structure 36 on spacers 41. The spacers 41 have a diameter of 140 μm. The distance g between adjacent mirror bodies 35 was 35 μm. These dimensions correspond to the actual conditions in a corresponding mirror device. They should not be understood as restrictive. An adaptation of the shielding elements provided according to the disclosure to alternative embodiments of the mirrors, in particular to mirror bodies with a dimension of 1 mm, is possible without any problem.

In the case of the exemplary embodiment as shown in FIG. 2, to produce the electric field 23 in the region between the side surfaces 22 of the mirror bodies 35, shielding electrodes 25 are respectively arranged in the region of the side surfaces 22. The shielding electrodes 25 extend in each case substantially over the entire side surface 22 of the mirror body 35, in particular over the entire thickness d thereof. Otherwise, in the formulas for $U_r$ presented above d denotes the extent of the shielding electrodes 25 in the direction of the extent of the thicknesses of the mirror bodies 35.

The ratio of the surface area of the shielding electrode 25 to the side surface 22 of the mirror body 35 is in particular at least 0.5, in particular at least 0.7, in particular at least 0.8, in particular at least 0.9, in particular at least 0.95, in particular at least 0.99.

A voltage source 63 is provided for applying a shielding voltage $U_r$ to the shielding electrodes 25. The voltage source 63 is only schematically indicated in the figures. It may be a component part of the multi-mirror array 29. It may in particular be arranged in the region of the carrying structure 36. It may also be an external voltage source.

The voltage source 63 is connected to the shielding electrodes 25 by way of electrical supply lines 64. The electrical supply lines 64 are arranged at least partly in the mirror body 35 and in the carrying structure 36.

FIG. 3A shows the case where the comb electrodes 24 of adjacent individual comb mirrors 27 are activated in such a way that the electric field produced by them is aligned substantially opposite to the electric field 23 between the side surfaces 22 of the respective mirror bodies 35. FIG. 3B shows the case where the electric field produced by the comb electrodes 24 points in the same direction as the electric field 23 produced by the shielding electrodes 25 in the region between the side surfaces 22 of the corresponding mirror bodies 35.

As can be seen qualitatively from FIGS. 3A and 3B, the electric field produced by the comb electrodes 24 has under the stated conditions a negligible influence, if any, on the distribution of the electric field strength in the electric field 23 in the region between the side surfaces 22 of the adjacent individual mirrors 27. The electric field 23 in this region is dominated by the voltage $U_r$ applied to the shielding electrodes 25. A shielding voltage $U_r$ of 80 V leads to a complete electrical shielding of the volume region behind the rear side 21 of the individual mirrors 27. The electric field 23 produced by the shielding electrodes 25 is substantially limited to the region between the side surfaces 22 of the adjacent individual mirrors 27. Applying the shielding voltage $U_r$ has the effect of producing a plateau of parallel equipotential lines. The electric field 23 can in other words be regarded as uniform and parallel to the reflection surfaces 34 of the individual mirrors 27. Although the electric field 23 reaching into the region in front of the front side of the mirror bodies 35 can have an influencing effect on charged particles in this region, this will not lead to a significant increase in their kinetic energy. In other words, the situations that are represented by way of example in FIGS. 3A and 3B do not lead to any leakage of the plasma 45 to the comb electrodes 24 and generally into the region behind the rear side 21 of the mirror bodies 35.

Furthermore, it has been possible to show that this also applies to the case where one or both of the adjacent individual mirrors 27 is/are in a pivoted position, in particular in the position pivoted to the maximum.

Figure 4:
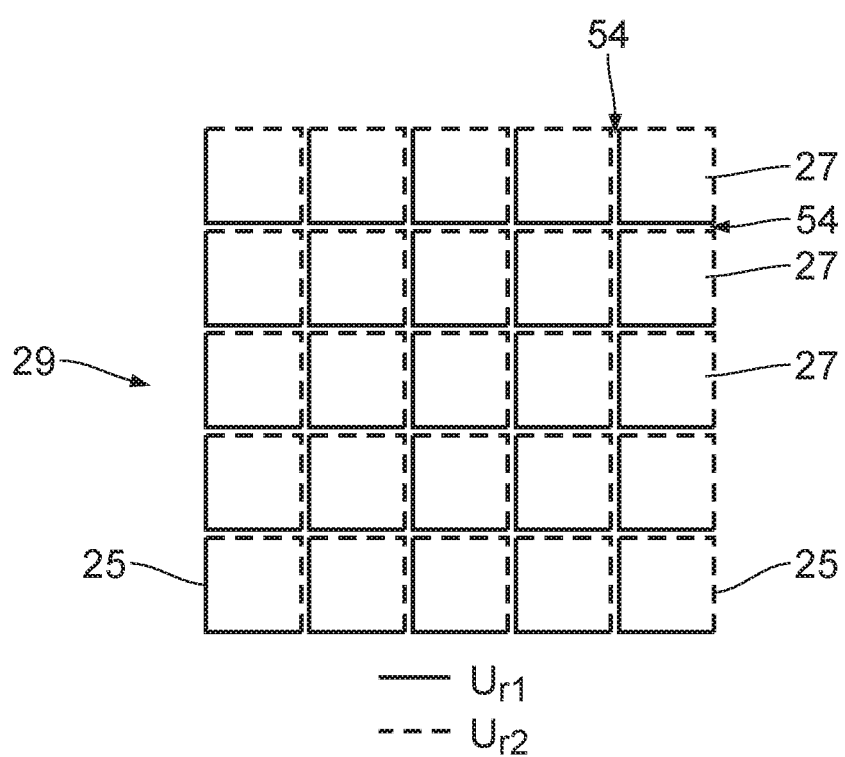
FIG. 4 schematically shows a detail from a plan view of a multi-mirror array for the exemplary illustration of an arrangement of pairs of shielding electrodes in the region of the side surfaces of adjacent individual mirrors.

There follows a description of further details of the shielding elements with reference to FIG. 4, in particular the arrangement of the shielding electrodes 25 in the multi-mirror array 29.

Shown by way of example in FIG. 4 is an arrangement of the individual mirrors 27 in the multi-mirror array 29 in which the shielding electrodes 25 are arranged in the region of the side surfaces 22 of the mirror bodies 35 of the individual mirrors 27 in such a way that an electric field 23 for shielding the plasma 25 can be produced between each of all the adjacent individual mirrors 27.

The shielding electrodes 25 are respectively arranged in pairs in the region of mutually opposite side surfaces 22 of adjacent individual mirrors 27. They serve in each case for building up the electric field 23 in the region between the adjacent individual mirrors 27.

In FIG. 4 it is schematically indicated that different voltages $U_r$ are applied to the shielding electrodes 25. A first voltage $U_{r1}$ is applied to a first subset of the shielding electrodes 25. A second voltage $U_{r2}$ is applied to a second subset of the shielding electrodes 25. In this case, it holds true that: $U_{r1} \neq U_{r2}$, in particular $|U_{r1} - U_{r2}| \geq 10$ V, in particular $|U_{r1} - U_{r2}| \geq 20$ V, in particular $|U_{r1} - U_{r2}| \geq 30$ V, in particular $|U_{r1} - U_{r2}| \geq 40$ V, in particular $|U_{r1} - U_{r2}| \geq V$, in particular $|U_{r1} - U_{r2}| \geq 70$ V, in particular $|U_{r1} - U_{r2}| \geq 100$ V. It holds true in particular that: $|U_{r1} - U_{r2}| \leq 300$ V, in particular $|U_{r1} - U_{r2}| \leq 200$ V, in particular $|U_{r1} - U_{r2}| \leq 100$ V.

In the case of the arrangement as shown in FIG. 4, two shielding electrodes 25 in side surfaces 22 adjacent to one another of the mirror body 35 are respectively equipotential, that is to say the same shielding potential is applied to them.

In the case of the arrangement as shown in FIG. 4, the application of electrical voltage to the shielding electrodes 25 is chosen especially such that all of the individual mirrors 27 have the same arrangement of shielding electrodes 25 with specific shielding potentials. Specifically, the shielding electrodes 25 of the individual mirrors pointing downward and to the left in FIG. 4 have in each case a first potential $U_{r1}$. The shielding electrodes 25 pointing upward and to the right are in each case kept at a second potential $U_{r2} \neq U_{r1}$. According to a preferred embodiment, the different shielding potentials have the same amplitude but reversed polarity. $U_{r1} = -U_{r2}$.

Other arrangements of the individual mirrors 27, that is to say the shielding potentials that are respectively applied to the shielding electrodes 25, are similarly possible. For example, starting from the arrangement as shown in FIG. 4, it is possible to turn each individual mirror 27 of the second, fourth, sixth, . . . (2n)th row by 90° counterclockwise. It is similarly possible to turn each individual mirror 27 of the second, fourth, sixth, . . . (2n)th column by 90° clockwise.

It is also possible to apply the same shielding potential in each case to the mutually opposite shielding electrodes 25 of each of the individual mirrors 27. In this case, adjacent individual mirrors 27 of a row or column are respectively arranged such that they are turned by 90° in relation to one another.

Which arrangement is chosen depends on the electrical architecture, the possible arrangement of the shielding cables and the supply lines. There follows a description with reference to FIGS. 5 to 12 of methods for producing the multi-mirror array 29. In the figures, only a detail with two individual mirrors 27 of the multi-mirror array 29 is represented in each case. The entire multi-mirror array 29 may be much larger. It may in particular include a multiplicity of rows and columns with individual mirrors 27. In the figures, views from above (left-hand column), sectional views (middle column) and views from below (right-hand column) of intermediate products after different individual method steps are respectively represented by way of example. In the figures, different materials are represented by different types of hatching.

The figures show a possible sequence of method steps for producing a MEMS multi-mirror array 29 that is suitable for use in a plasma environment. A desired precondition for this is that the internal electrical components, in particular circuits, actuators, sensors and also in particular ASICs, operate undisturbed. They are in particular protected from free charges from the plasma environment.

FIGS. 5 to 8 show the sequence of method steps for producing a multi-mirror array 29 in which three different electrical potentials are applied to the reflection surface 34 and also in each case two pairs of adjacent side surfaces 22. FIGS. 5 to 8 show by way of example the sequence of method steps for producing a multi-mirror array 29 that is formed in such a way that different voltages can respectively be applied to the front side of the individual mirror 27 and in each case two pairs of respectively adjacent side surfaces 22. FIGS. 9 to 12 show an alternative in which the same potential is applied to the front side of the individual mirror 27 as to a pair of the side surfaces 22. The sequence of the method steps is substantially identical and is therefore described together for both alternatives. Any differences are pointed out.

Firstly, the production of a mirror wafer 46 is described with reference to FIGS. 5 and 9. For the production of the mirror wafer 46, first double SOI wafers 47 (silicon-on-isolator wafers) are provided (1-0). The doping of the SOI wafers 47 depends on the desired electrical resistance of the mirrors. It can be suitably chosen according to desired properties.

In a first method step (1-1), the bordering of the mirrors 48 and diagonal incisions 49 are defined. The diagonal incisions 49 divide the mirror plate into three parts: a cylindrical volume 50, which serves for the forming of an electrical contact in relation to the mirror surface, and also two triangular parts 51. The two triangular parts 51 each have two adjacent side surfaces 22.

Figure 9:
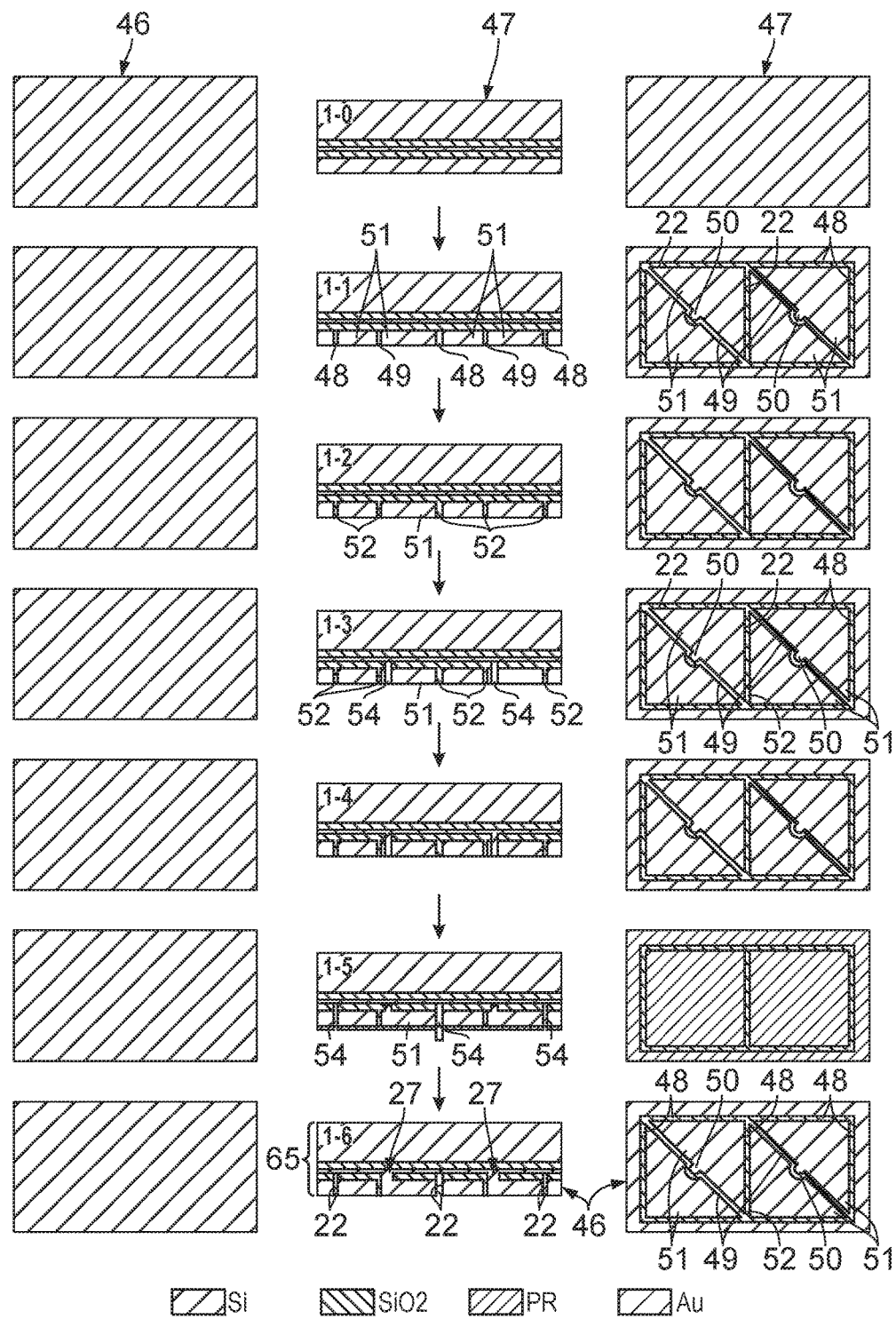
FIGS. 9 to 12 show representations as shown in FIGS. 5 to 8 according to an alternative.

In the case of the variant according to FIG. 9, the cylindrical volume 50 is not completely separate, but is connected to one of the triangular parts 51.

Then, a lithographic fashioning is provided for the microstructuring of the SOI wafers 47 with a vertical profile. The lithographic fashioning is followed by a DRIE (Deep Reactive Ion Etching). This involves suitably selecting the correct etching gases and repeatedly carrying out etching and passivation in a predetermined sequence (so-called Bosch process).

An ICP etcher (Inductively Coupled Plasma Etcher) with $SF_6$ as the etching gas and $CHF_3$ or $C_4F_8$ as the polymer-forming gas may be provided for such a DRIE process.

Then (1-2), the etched incisions 49 are filled. A TEOS-$SiO_2$ (tetraethylorthosilicate) method may be used for this. This serves the purpose of depositing $SiO_2$ layers 52 quickly, in particular at a rate in the range from 25 nm/min to 100 nm/min. The temperature lies here in the range from 600° C. to 800° C.

The rear side of the SOI wafers 47 may then be polished.

It is then envisaged to produce a contact area in relation to the mirror surface. A lithography step is provided for this. It is in particular envisaged to produce a clearance, in particular a circular clearance, in the photoresist in the region of the center of the mirror. Then, a vertical silicon DRIE process is carried out with an etching resist on the second covered oxide.

Figure 5:
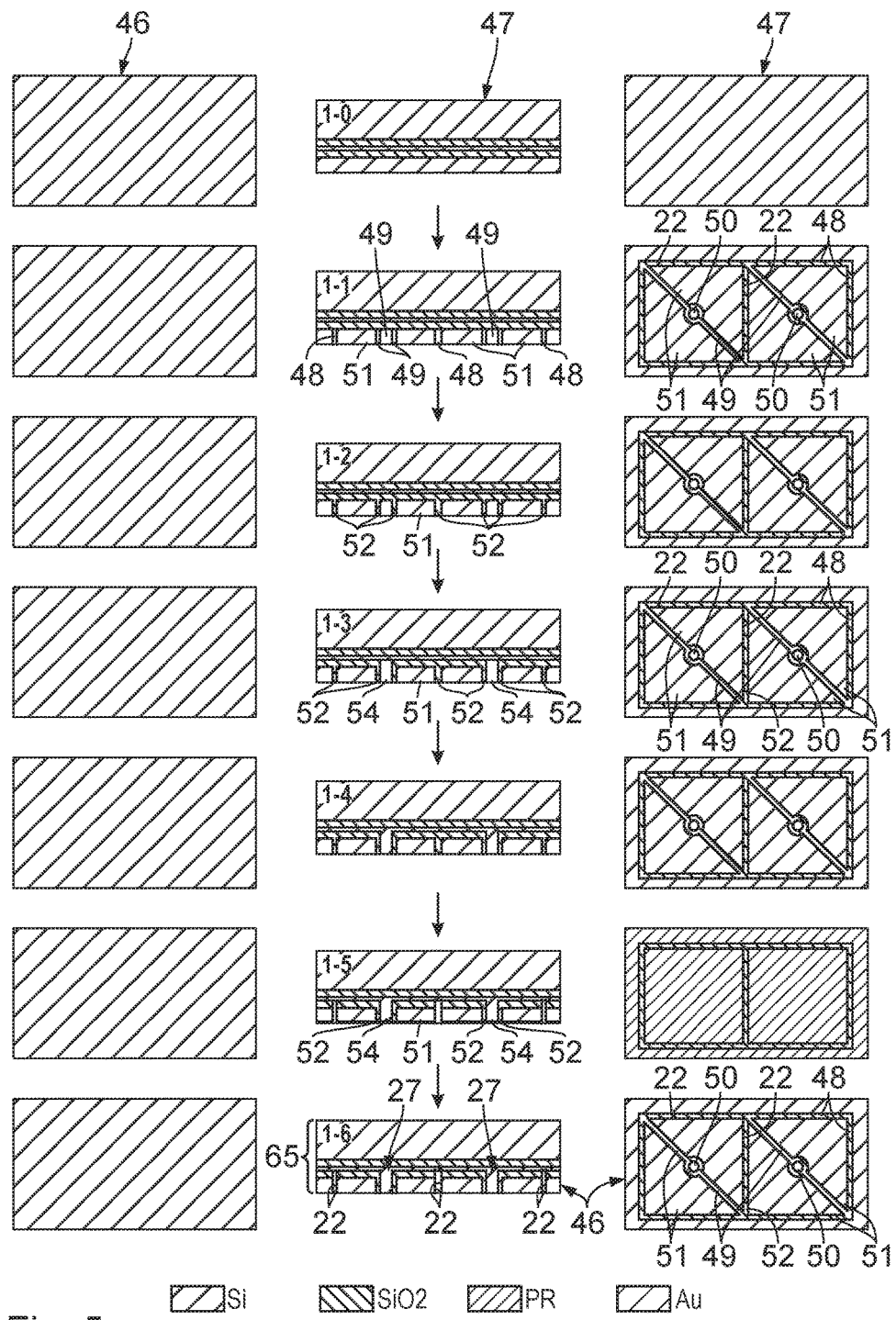
FIG. 5 schematically shows a view from above (left-hand column), from below (right-hand column) and in a vertical section (middle column) of a sequence of intermediate products in the case of a method for producing the individual mirrors.

In the case of the alternative as shown in FIG. 5, the etching process is laterally delimited by the outer silicon dioxide hollow cylinder itself. A rapid isotropic silicon etching with $SF_6$ gas can be used. In the case of the alternative as shown in FIG. 9, it is envisaged to use a so-called Bosch process, that is to say a sequence of repeated etching and passivation steps.

The access to the upper mirror layer is completed by polymer passivation of the $SiO_2$ side walls and subsequent anisotropic $SiO_2$-reactive ion etching (RIE) with $CHF_3$+Ar or $CHF_3$+$CF_4$ gases and gas pressure. Greater anisotropy of the etching process is achieved with higher wafer bias, in particular with a wafer bias of more than 100 V. The electrical connection to the upper layer of the mirror is completed by filling the etched structures with doped polysilicon. Subsequently, rear-side polishing may be provided if desired (1-4).

Then, the interspaces 54 between the individual mirrors 27 are opened. For this, the filled TEOS between the individual mirrors 27 may be chemically etched in BHF (Buffered Hydrofluoric Acid). The rest of the wafer surface may be protected during this with a photoresist mask (1-5).

As the last step in the production of the mirror wafer 46, the side surfaces 22 are passivated. Furthermore, the silicon between the two buried oxide layers is structured. A DRIE process serves for this. The process stops automatically when the upper oxide layer is reached. At the end, the photoresist is removed. The finished mirror wafer 46 has three-layer mirror plates 65 (1-6).

Figure 6:
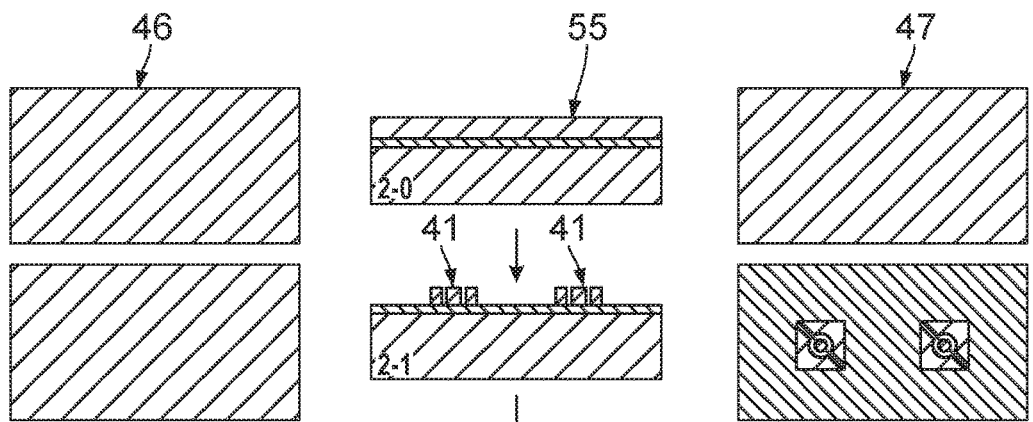
FIG. 6 shows a representation corresponding to FIG. 5 in the case of a method for producing a holding pin.
Figure 10:
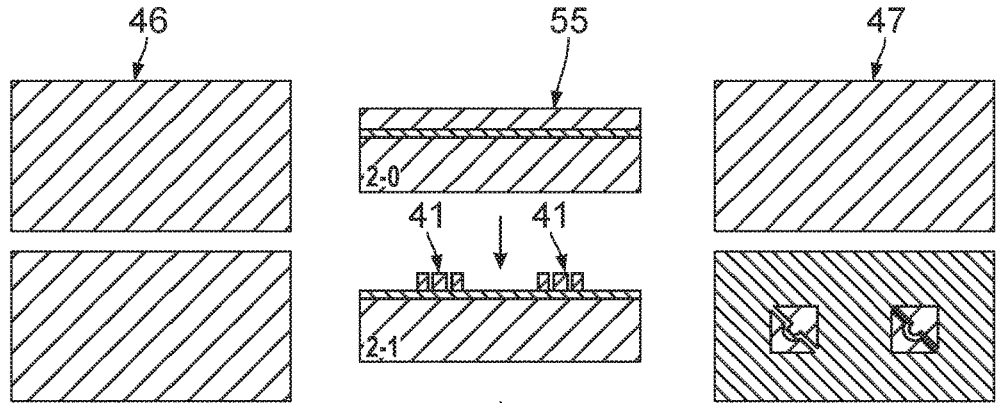

The production of the spacers 41 is explained on the basis of FIGS. 6 and 10. For the production of the spacers 41, a second SOI wafer 55 is provided (2-0). The second SOI wafer 55 is structured via a DRIE process (2-1). This may involve producing a two-part spacer 41 (FIG. 10) or a three-part spacer 41 (FIG. 6).

The spacer 41 allows the arrangement of the mirror bodies 35 above their suspension. This design of the mirror bodies 35 on the spacers 41 makes it possible to pivot the mirrors 27 with the aid of integrated micro-actuators, in particular with two degrees of pivoting freedom.

In addition to the mechanical function, the spacers 41 have the task of receiving the electrical connections to the mirror bodies 35.

Figure 7:
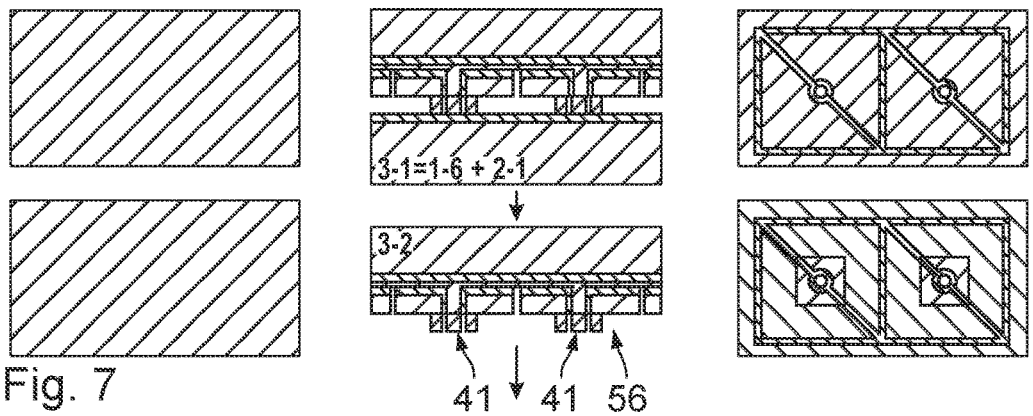
FIG. 7 shows a representation corresponding to FIGS. 5 and 6 in the case of a method for producing a mirror element assembled from the mirror as shown in FIG. 5 and the holding pin as shown in FIG. 6.
Figure 8:
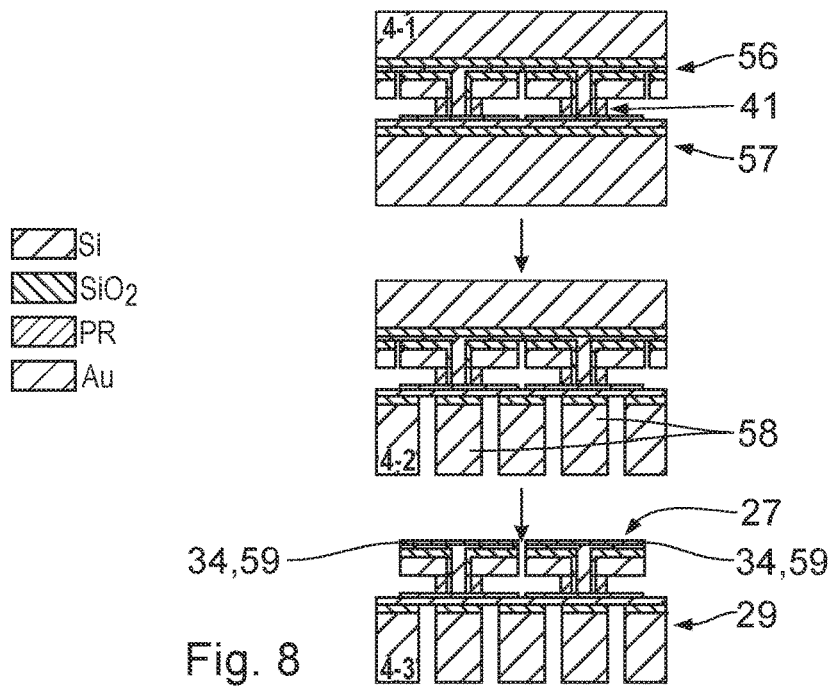
FIG. 8 shows a representation of a vertical section through intermediate products in the case of a method for producing a multi-mirror array from the assembled mirror as shown in FIG. 7.
Figure 11:
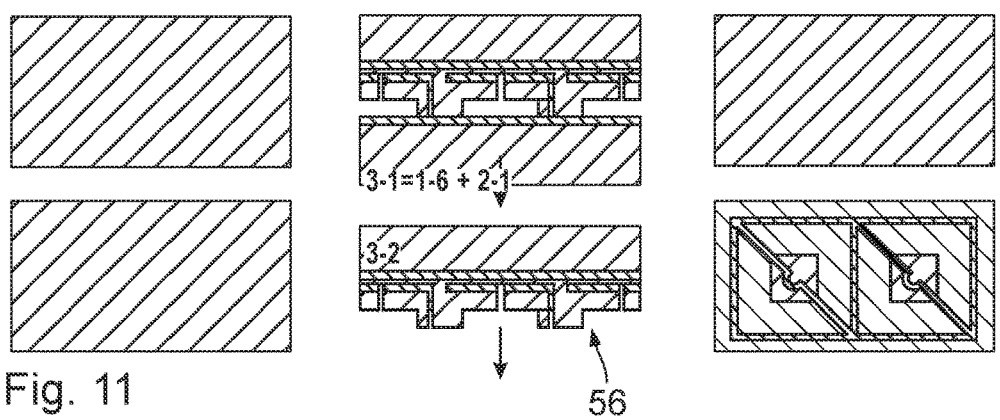
Figure 12:
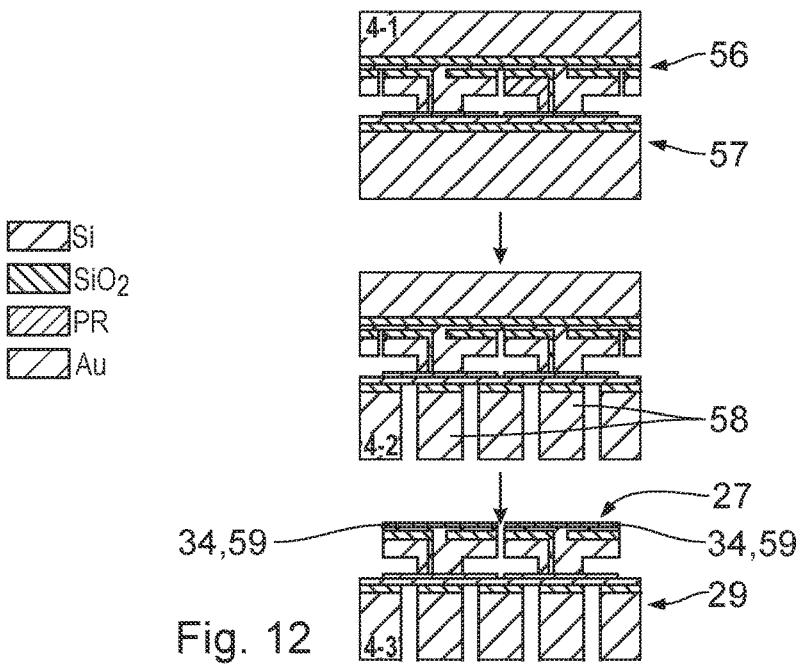

The production of a composite mirror wafer 56 is explained on the basis of FIGS. 7 and 11. For the production of the composite mirror wafer 56, the mirror wafer 46 is connected to the structured second SOI wafer 55 with the spacers 41. A direct or eutectic bonding process may be provided for this (3-1). Subsequently, the holding wafer and the covered oxide of the second SOI wafer 55 are removed. A subsequent silicon and silicon-dioxide etching may be provided for this. $SF_6$ or $XeF_2$ plasma may be provided for example for the isotropic etching of silicon. $CHF_3/CF_4$ plasma or HF acid vapor may be provided for the etching of the covered oxide.

The assembled mirrors produced in such a way may be further processed in known process sequences. As represented schematically and by way of example in FIGS. 8 and 12, the composite mirror wafer 56 may be connected to an actuator wafer 57. The actuator wafer 57 includes integrated actuators. It may also include sensors, in particular for sensing the displacement position of the individual mirrors 27. In an etching step (4-2), the central electrodes 58 are etched free, starting from the rear side of the actuator wafer 57.

Then, the mirror surface is exposed (4-3). A successive etching of the holding wafer placed on top and the covered $SiO_2$ layer, which was a component part of the SOI wafer 47, is provided for this.

Finally, an EUV-reflective coating 59 is deposited onto the mirror surface in order to produce the reflection surfaces 34 of the individual mirrors 27. The mirror surface has a sub-nanometer roughness. It is protected from defects and contamination during the entire production process up until the time of the deposition of the EUV-reflective coating by the covered oxide layer of the double SOI wafer 47.

Figure 13:
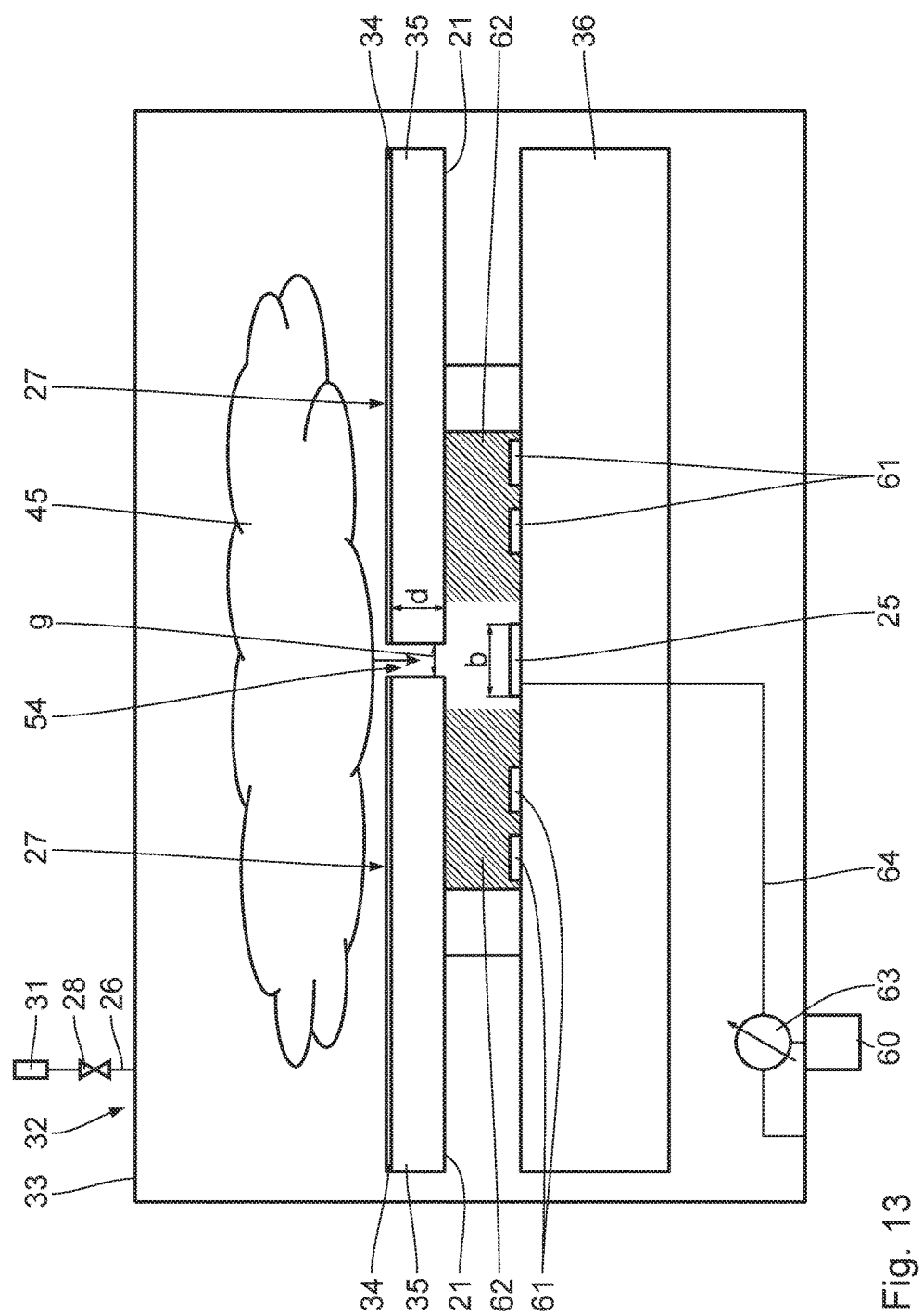
FIG. 13 shows a representation as shown in FIG. 2 of an alternative embodiment of the shielding element.
Figure 14:
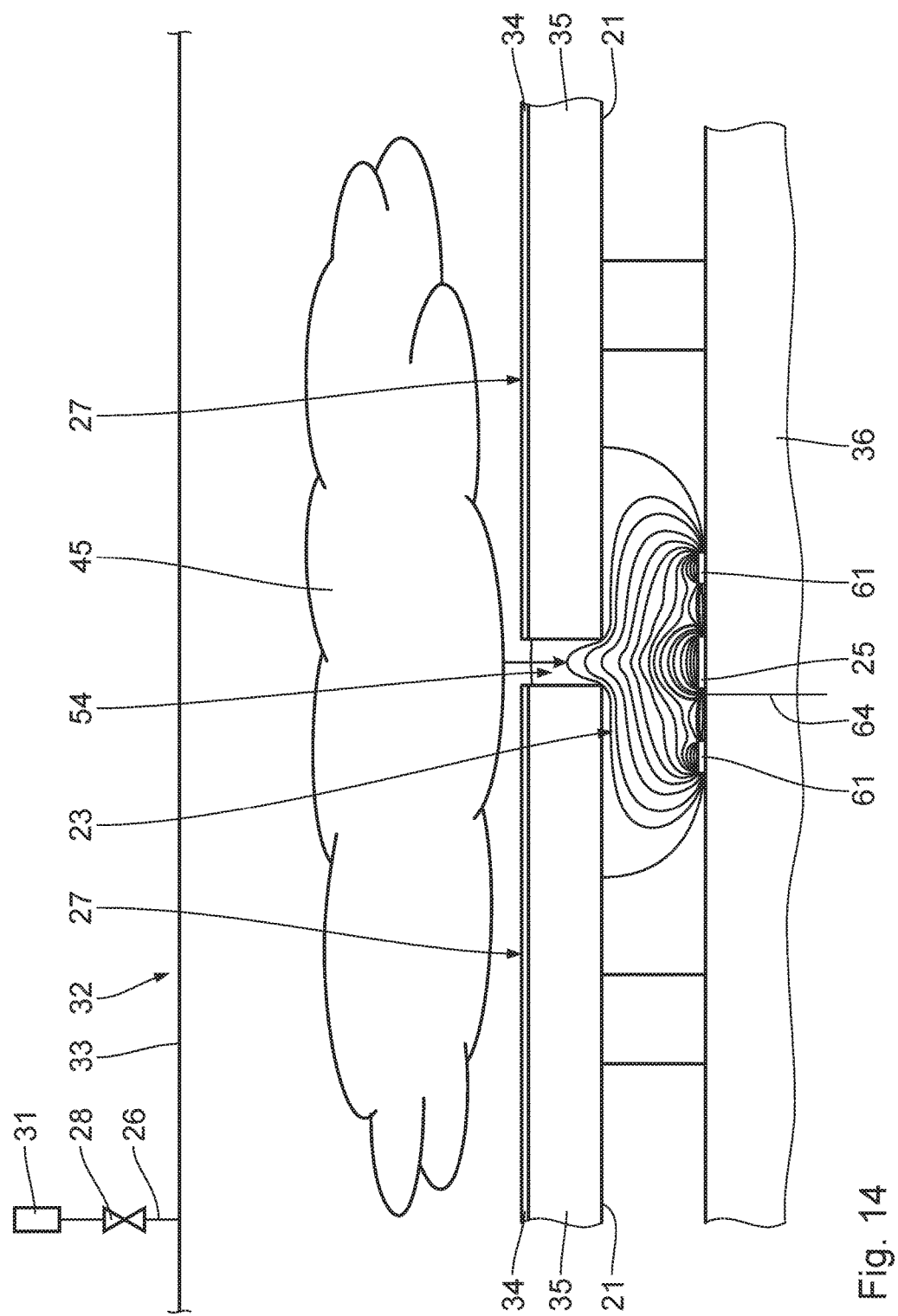
FIG. 14 shows a representation of an exemplary pattern of the field lines of an electric field in the case of an activation of the shielding element as shown in FIG. 13.

There follows a description with reference to FIGS. 13 and 14 of an alternative embodiment of the multi-mirror array 29 with shielding elements. Identical parts are given the same reference signs as in the case of the exemplary embodiments described above, to which reference is hereby made. In the case of the embodiment shown in FIGS. 13 and 14, the shielding electrodes 25 are arranged in the region behind the rear side 21 of the individual mirrors 27. The shielding electrodes 25 are in particular arranged on the carrying structure 36. They may be formed in particular as shielding wires.

The shielding electrodes 25 are arranged in particular in the region behind the interspace between two adjacent mirrors 27.

They may have in each case a width b that is greater than the distance g between adjacent individual mirrors 27. This allows a leakage of the plasma to be prevented particularly effectively. It holds in particular that: b:g≥0.5, in particular b:g≥0.7, in particular b:g≥1.5, in particular b:g≥2, in particular b:g≥3. The width b of the shielding electrodes 25 is substantially limited by the overall space available and the functional safety clearance for avoiding electrical sparkovers to adjacent lines.

The shielding electrodes 25 are also referred to as active wires. They can protect the volume region behind the rear side of the individual mirrors 27 and also in particular the electronic components arranged therein from free charges. They can in particular prevent the diffusion of free charges in this volume region. In particular, a controllable electrical voltage can be applied to the shielding electrodes 25 via a control device 60. The shielding voltage that is applied to the shielding electrodes 25 can be adapted in particular to the mirror geometry and also to the energy to be expected of the free charge carriers in the region in front of the front side of the mirrors 27.

A positive shielding voltage may be applied to the shielding electrodes 25. They serve in this case as an attractor for free electrons and also negatively charged ions. In this case, they have a repellent effect on positively charged particles.

A negative voltage may also be applied to the shielding electrodes 25. In this case, they have a repellent effect on electrons and other negatively charged particles and an attractive effect on positively charged particles.

A disturbance of the sensitive electronic components 61 in a predetermined volume region 62 to be shielded can be effectively prevented by the shielding electrodes 25.

The sensitive electronic components 61 to be shielded are indicated by way of example in FIGS. 13 and 14. These may be sensitive signal and/or current lines. They may also be more complex electronic components, for example ASICs.

Embodying the shielding elements as shielding electrodes 25 that are arranged on the carrying structure 36 can be realized particularly easily. It involves only very low power consumption. It leads to very reliable shielding of the volume region 62 to be shielded.

Alternatives and developments of the embodiment represented in FIGS. 13 and 14 are described below in the form of keywords.

Instead of individual shielding electrodes 25, the shielding elements may also have a different form and/or structure. They may in particular include in each case two or more wires, in particular wires arranged parallel to one another. They may also be formed by a grid. In the case of these alternatives, it is possible to apply different voltages to different wires and/or different regions of the grid.

The shielding electrodes 25 may have a surface of metal. They may also have a surface of polysilicon.

The shielding elements may also be formed as coils or coil-like structures. In this case, a magnetic field produced by the shielding elements may in particular also be used for shielding the volume region 62.

Combinations of the various alternatives of the shielding elements are possible.

What is claimed is:

1. A mirror device, comprising:
   a mirror comprising a mirror body, the mirror body comprising a front side, a rear side and a side surface;
   a first electrically conductive shielding element; and
   a second electrically conductive shielding element which is separate from the first electrically conductive shielding element,
   wherein the mirror device is configured so that, during use, a voltage applied to the first electrically conductive shielding element is different from a voltage applied to the second electrically conductive shielding element so that the first and second electrically conductive shielding elements produce an electric field in a region adjacent to at least one member selected from the group consisting of the side surface of the mirror body and the rear side of the mirror body.

2. The mirror device of claim 1, wherein the first electrically conductive shielding element is in a region of the side surface of the mirror body.

3. The mirror device of claim 1, wherein the first electrically conductive shielding element is in a region on or behind the rear side of the mirror body.

4. The mirror device of claim 1, further comprising a voltage source configured to apply electrical voltage to at least one member selected from the group consisting of the first electrically conductive shielding element and the second electrically conductive shielding element.

5. The mirror device of claim 4, further comprising a control device configured to control the electrical voltage.

6. The mirror device of claim 1, further comprising a control device configured to control the voltage applied to the first electrically conductive shielding element and the voltage applied to the second electrically conductive shielding element.

7. The mirror device of claim 1, further comprising electrical supply lines configured to apply voltages to the first and second electrically conductive shielding element.

8. The mirror device of claim 1, wherein the mirror body comprises electrical supply lines configured to apply voltages to the first and second electrically conductive shielding element.

9. The mirror device of claim 1, wherein the first electrically conductive shielding element is on a first side of the mirror body, the second electrically conductive shielding element is on a second side of the mirror body, and the first side is different from the second side.

10. The mirror device of claim 1, wherein the first electrically conductive shielding element is in a first side of the mirror body, the second electrically conductive shielding element is in a second side of the mirror body, and the first side is different from the second side.

11. The mirror device of claim 1, wherein:
the mirror device comprises a plurality of mirrors;
each mirror comprises:
 a mirror comprising a mirror body, the mirror body comprising a front side, a rear side and a side surface;
 a first electrically conductive shielding element; and
 a second electrically conductive shielding element which is separate from the first electrically conductive shielding element; and
each mirror device is configured so that, during use, a voltage applied to its first electrically conductive shielding element is different from a voltage applied to its second electrically conductive shielding element so that its first and second electrically conductive shielding elements produce an electric field in a region adjacent to at least one member selected from the group consisting of the side surface of the mirror body and the rear side of the mirror body.

12. The mirror device of claim 11, wherein an electrically conductive shielding element is in a region behind an interspace between two adjacent mirrors.

13. The mirror device of claim 11, wherein two electrically conductive shielding elements are arranged in pairs in a region of mutually opposite side surfaces of adjacent mirrors.

14. A unit, comprising:
a mirror device according to claim 1,
wherein the unit is a projection exposure lithography illumination optical unit.

15. A system, comprising:
a radiation source; and
an illumination optical unit,
wherein:
 the illumination optical unit comprises a mirror device according to claim 1; and
 the system is a projection exposure lithography illumination system.

16. An apparatus, comprising:
an illumination optical unit configured to illuminate an object field; and
a projection optical unit configured to project the illumination radiation from the object field into an image field,
wherein:
 the illumination optical unit comprises a mirror device according to claim 1; and
 the apparatus is a microlithographic projection exposure apparatus.

17. A method of using an apparatus comprising an illumination optical unit and a projection optical unit, the method comprising:
using the illumination optical unit to illuminate an object in an object field; and
using the projection optical unit to project the illumination radiation from the object field into an image field,
wherein the illumination optical unit comprises a mirror device according to claim 1.

18. A mirror device, comprising:
a mirror comprising a mirror body;
a first electrically conductive shielding element; and
a second electrically conductive shielding element which is separate from the first electrically conductive shielding element,
wherein:
 the mirror body comprises a first side, a second side different from the first side, and a third side different from both the first and second sides; and
 the mirror device is configured so that, during use, a voltage applied to the first electrically conductive shielding element is different from a voltage applied to the second electrically conductive shielding element so that the first and second electrically conductive shielding elements produce an electric field in a region adjacent to at least one member selected from the group consisting of the second side of the mirror body and the third side of the mirror body.

19. The mirror device of claim 18, wherein the third side of the mirror body supports a surface configured to reflect EUV radiation.

20. A mirror device, comprising:
a mirror comprising a mirror body;
a first electrically conductive shielding element; and
a second electrically conductive shielding element which is separate from the first electrically conductive shielding element,
wherein:
 the mirror body comprises first, second and third sides;
 the first side of the mirror body supports a surface configured to reflect EUV radiation;
 the second side of the mirror body is opposite the first side of the mirror body;
 the third side of the mirror body connects the first and second sides of the mirror body;
 the second side of the mirror body supports the first electrically conductive shielding element;
 the third side of the mirror body supports the second electrically conductive shielding element; and
 the mirror device is configured so that, during use, a voltage applied to the first electrically conductive shielding element is different from a voltage applied to the second electrically conductive shielding element so that the first and second electrically conductive shielding elements produce an electric field in a region adjacent to at least one member selected from the group consisting of the second side of the mirror body and the third side of the mirror body.

* * * * *

UNITED STATES PATENT AND TRADEMARK OFFICE
CERTIFICATE OF CORRECTION

PATENT NO. : 10,101,507 B2  
APPLICATION NO. : 15/621555  
DATED : October 16, 2018  
INVENTOR(S) : Yanko Sarov et al.

Page 1 of 1

It is certified that error appears in the above-identified patent and that said Letters Patent is hereby corrected as shown below:

On the Title Page

Column 1 (Inventors), Line 4, delete "Heindenheim" and insert -- Heidenheim --, therefor.

In the Specification

Column 8, Line 46, delete "they" and insert -- the y --, therefor.

Column 8, Line 51, delete "they" and insert -- the y --, therefor.

Column 9, Line 23, delete "2010/049 076" and insert -- 2010/049076 --, therefor.

Column 9, Line 65, delete "2010/049 076" and insert -- 2010/049076 --, therefor.

Column 10, Line 3, delete "the the" and insert -- the --, therefor.

Column 12, Line 33, (Approx.) delete "($E_{ph}$32" and insert -- ($E_{ph}$= --, therefor.

Column 14, Line 37, delete "$|U_{r1}-U_{r2}|\geq V$," and insert -- $|U_{r1}-U_{r2}|\geq 50\ V$, --, therefor.

Signed and Sealed this  
Twenty-sixth Day of March, 2019

Andrei Iancu  
*Director of the United States Patent and Trademark Office*